United States Patent
Shao et al.

(10) Patent No.: US 7,958,437 B2
(45) Date of Patent: Jun. 7, 2011

(54) MAP DETECTOR WITH A SINGLE STATE METRIC ENGINE

(75) Inventors: Rose Shao, Worcester, MA (US); Yie Jia, North Grafton, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 1103 days.

(21) Appl. No.: 11/694,606

(22) Filed: Mar. 30, 2007

(65) Prior Publication Data

US 2008/0240303 A1    Oct. 2, 2008

(51) Int. Cl.
*H03M 13/03* (2006.01)
(52) U.S. Cl. .................. 714/796; 714/794; 714/786
(58) Field of Classification Search .................. 714/796, 714/794, 792, 746, 786, 769; 375/265, 268, 375/341
See application file for complete search history.

(56) References Cited

U.S. PATENT DOCUMENTS

| | | | |
|---|---|---|---|
| 5,933,462 A | 8/1999 | Viterbi et al. | |
| 6,028,899 A * | 2/2000 | Petersen | 375/341 |
| 6,901,119 B2 * | 5/2005 | Cideciyan et al. | 375/341 |
| 7,020,214 B2 * | 3/2006 | Bickerstaff | 375/265 |
| 7,209,527 B2 * | 4/2007 | Smith et al. | 375/341 |
| 7,810,018 B2 * | 10/2010 | Cheng | 714/794 |

* cited by examiner

*Primary Examiner* — Fritz Alphonse
(74) *Attorney, Agent, or Firm* — Westman, Champlin & Kelly, P.A.

(57) ABSTRACT

A maximum a posteriori detector includes a single state metric engine that performs forward and backward processing to produce forward and backward state metrics. The state metric engine includes a plurality of processes that each perform both the forward and the backward processing operations. The system further includes memory that stores the forward and backward state metrics that are produced by the engine in appropriate orders for the forward and backward processing. A number of multiplexers provide the appropriate branch metrics and apriori values to adder strings in each of the processors in accordance with an associate decoding trellis.

18 Claims, 4 Drawing Sheets

MAP DETECTOR WITH A SINGLE STATE METRIC ENGINE

BACKGROUND OF THE INVENTION

1. Field of the Invention

The invention relates generally to maximum a posteriori (MAP) detectors and more particularly to processing engines utilized in the MAP detectors.

2. Background Information

MAP detectors are used in decoding operations that produce soft values for the bits of a data block. The soft values consist of sign values, or hard decisions, and associated confidence information. The soft values produced by the MAP detector are typically used in a known manner in an iterative decoder that produces decoded data.

The MAP detector processes samples of a received signal in accordance with a multiple-state decoding trellis. Typically, the MAP detector performs both forward and backward processing operations in accordance with the trellis, and then manipulates the results to produce the soft values. The forward processing operations, referred to also as $\alpha$-processing, process information in a known manner in accordance with paths proceeding in a forward direction through the trellis. Thus, the forward processing operations produce state metrics for time t+1, that is, trellis path location t+1, based on the state metrics previously calculated for time t. For convenience, we refer herein to the state metric values produced by the forward processing operations as "forward state metrics."

The backward processing operations, also referred to as $\beta$-processing, process information in a known manner in accordance with paths proceeding in a backward direction through the trellis. The backward processing operations produce state metrics for time t, based on the state metrics calculated for time t+1. For convenience, we refer to the state metric values produced by the backward processing operations as "backward state metrics." The MAP detector then manipulates the forward and backward state metrics calculated for corresponding locations and produces the associated soft values.

The forward state metric processing and the backward state metric processing produce the forward and backward state metrics for a given state based on different starting points, or states, of the trellis and different branches of the trellis. The forward processing, for example, calculates the forward state metrics for a given state based on the forward state metrics calculated for the previous states on the two branches leading in the forward direction to the given state. The forward processing then combines, or adds, the calculated forward state metrics, associated branch metrics and apriori values to produce forward sums for the respective branches. Finally, the forward processing compares the two sums and selects the appropriate one, for example, the smaller one, as the forward state metric.

The backward processing calculates the backward state metrics for the given state based on the calculated backward state metrics for the states at the ends of the two branches leading in a backward direction from the given state. The backward processing combines, or adds, the calculated backward state metrics and associated branch metrics and apriori values to produce backward sums for the respective branches. The backward processing then compares the two sums and in the example selects the smaller one as the backward state metric.

The processing operations are performed respectively by forward ACS (add-compare-select) processors and backward ACS processors, in analogy to ACS units in a Viterbi detector. A forward state metric engine includes "j" forward ACS processors, where j is the number of states in the matrix, and a backward state metric engine includes j backward ACS processors.

To avoid large memory requirements and long latencies, MAP detectors perform the forward and backward processing operations over sections of a sector to produce associated soft values. Known MAP detectors utilize a forward state metric engine, that is, a set of j forward ACS processors, and a backward state metric engine, that is, a set of j backward ACS processors, or one set of forward and two sets of backward ACS processors that operate over successive sections of the sector to save memory and shorten the associated latency. In another known implementation multiple MAP detectors are used for parallel processing. Each MAP detector consists of two sets of forward processors and two sets of backward processors to provide a continuous output of the soft values.

The various branch and state metric values that are manipulated in the forward and backward processing are multiple-bit values. Accordingly, the forward and the backward state metric engines each consist of a plurality of multiple-bit adders, multiple-bit comparators and multiple-bit selection multiplexers. The forward and backward state metric engines are thus relatively complex, and expensive, and also relatively large. Accordingly, the use of the multiple state metric engines adds considerably to the complexity, cost and size of the MAP detector.

SUMMARY OF THE INVENTION

The invention is a MAP detector that uses a single state metric engine to perform both forward and backward processing. The system includes memory that stores one set of forward state metrics and "C" sets of backward state metrics in appropriate orders for the forward and backward processing, where C is the convergence length of the associated trellis. A small number of multiplexers are added to the state metric engine to provide the appropriate branch metrics and apriori values for the forward and backward processing. Using the single state metric engine, the MAP detector provides soft values at a throughput that is typically one third of the clock rate. Thus, the MAP detector is useful in applications where low cost is desired and the throughput requirement is relaxed, such as in error recovery modes of read channel operations.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
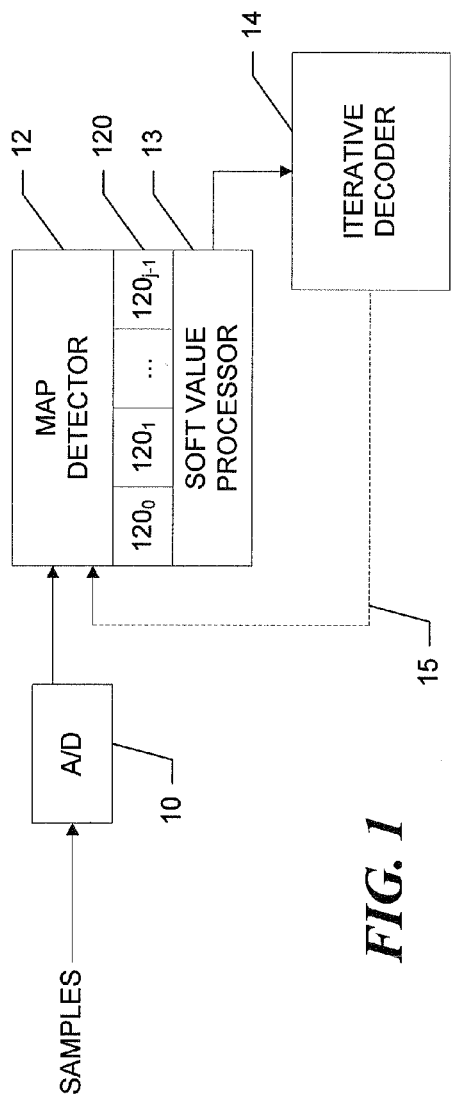
FIG. 1 is a functional block diagram of a system constructed in accordance with the invention.

Referring now to FIG. 1, samples from a channel are provided to an analog to digital (A/D) converter 10 that operates in a known manner to produce input values for a MAP detector 12. The MAP detector 12, as discussed in more detail below, produces soft values that correspond to the data bits received over the channel using a single state metric engine 120. For a j state trellis, the metric state engine includes j ACS processors 120₀, 120₁, ... 120_{j-1} to calculate the forward and backward state metrics. The channel (not shown) may, for example, be a read channel of a disk drive or a receive channel of a communication device. The soft values produced by the MAP detector are supplied to a soft decoder, for example, iterative decoder 14, that operates in a known manner to produce the corresponding decoded bits.

As part of iterative decoding operations, the soft values produced by the decoder 14 may be supplied to the MAP detector as input apriori values, as denoted by the dotted line 15. The MAP detector 12 and the decoder 14 then operate together until convergence or until an end event, such as the expiration of a decoding timer or an iteration counter.

Figure 2:
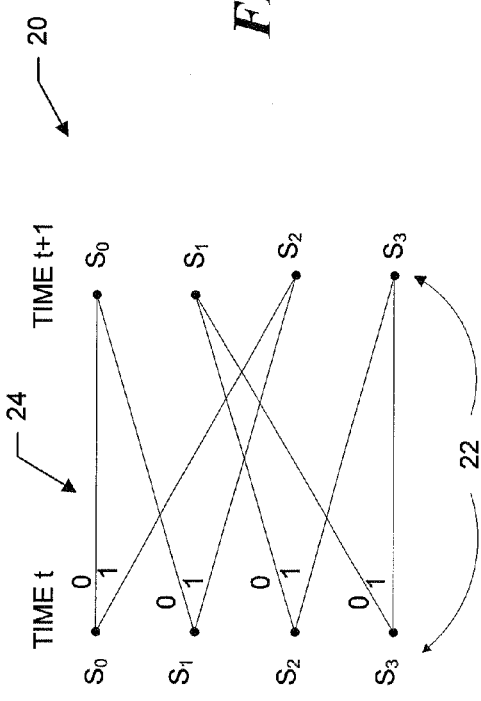
FIG. 2 illustrates a trellis section used in the MAP detector of FIG. 1.

Referring also to FIG. 2, the MAP detector 12 operates in accordance with a multiple state decoding trellis 20 in which the states $S_i$, which are represented by nodes 22, are interconnected by branches 24. For ease of understanding, FIG. 2 depicts a four state trellis, j=4, for a memory two channel. The same trellis is used over the whole block time by the state metric engine 120. The respective forward and backward decoding steps are performed over sections of the data that are multiples of C locations, where C is the convergence length of the channel, as illustrated by time lines shown in FIG. 5. The processing operations are discussed in more detail below.

The MAP detector 12 performs first a backward processing operation, $\beta_1$, for bit locations 2C−1 to 0, with a starting backward state metric of all zeros for time 2C, indicating no known starting state. The backward processing operation has a convergence phase that includes the first C locations and an output phase that includes the next C locations. The values produced during the convergence phase are not reliable and are discarded, though the calculations are necessary for producing reliable state metrics in the output phase. The backward state metrics produced for locations C−1 to 0 are reliable and are saved, as discussed below with reference to FIGS. 3A-B.

Next, a forward processing operation, $\alpha_1$, is performed. Since the forward processing operation starts from time 0 of a data block, the state with which to start the forward calculations is known. For example, in a read channel the known bits (preamble) before a data block in a sector determine the state with which the detector should start. We can therefore assign favorable state metrics to that known start state and unfavorable state metrics to the other states. Hence, a convergence phase for forward processing is omitted.

The $\alpha_1$ operation thus starts with known state metrics for time 0, and produces reliable state metrics, which can be directly combined with the stored backward state metrics to produce soft values for bits 0 to C−1. Accordingly, once the forward state metrics for a given location are calculated, they are manipulated along with the calculated backward state metrics for the corresponding location in a known manner by a soft value processor 13 to produce the respective soft values. The soft values are then provided to the decoder 14. The forward and backward processing operations are discussed in more detail below with reference to FIGS. 3A-B and 4.

Figure 3A:
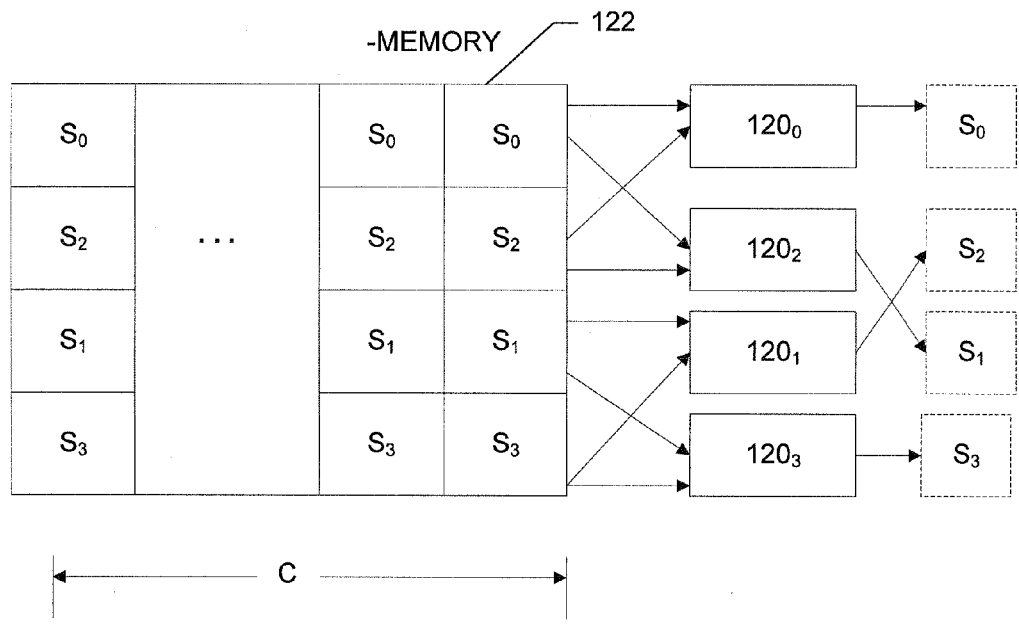
FIGS. 3A-B are functional block diagrams of state metric engines and memory included in the MAP detector of FIG. 1.
Figure 3B:
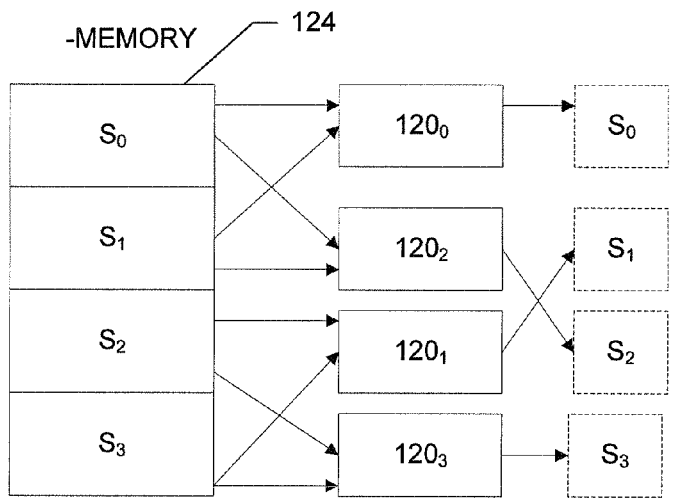

In the MAP detector 12, a state metric engine 120 is utilized to produce the calculated state metrics for the j trellis states in both the forward and the backward processing directions. As shown in FIG. 2, four ACS processors 120₀, 120₁, 120₂ and 120₃ produce both the backward state metrics and the forward state metrics for the states $S_0, S_1, S_2$ and $S_3$. In the example of FIG. 3A and 3B, the ACS processor 120₂ produces the forward state metric for state $S_2$ and the backward state metric for $S_1$. The backward and forward processing operations are first discussed in general and then in more detail with reference to FIGS. 3A-B and FIG. 4.

Referring now to FIGS. 3A-B, the state metric engine 120 is associated with a $\beta$-memory 122 that retains the C reliable backward state metrics produced during the output phase of each backward, or $\beta$, processing operation. The $\beta$-memory is a first in last out (FILO) memory. Further, the state metric engine is associated with an $\alpha$-memory 124, which stores the forward state metrics as they are calculated for each location in a given forward processing operation. When a new forward state metric is calculated, the $\alpha$-memory is overwritten. The forward state metric calculated for the last location in the forward processing operation is retained in the $\alpha$-memory for use in the first step in the next forward processing operation. The $\alpha$-memory thus provides reliable initial forward state metrics for the next operation, and a convergence phase is not required for the forward processing. As illustrated in the drawing and as discussed in more detail below, the state metrics used in the forward processing operations and in the backward processing operations are stored in different orders in the $\alpha$ and $\beta$ memories 122 and 124.

Figure 5:
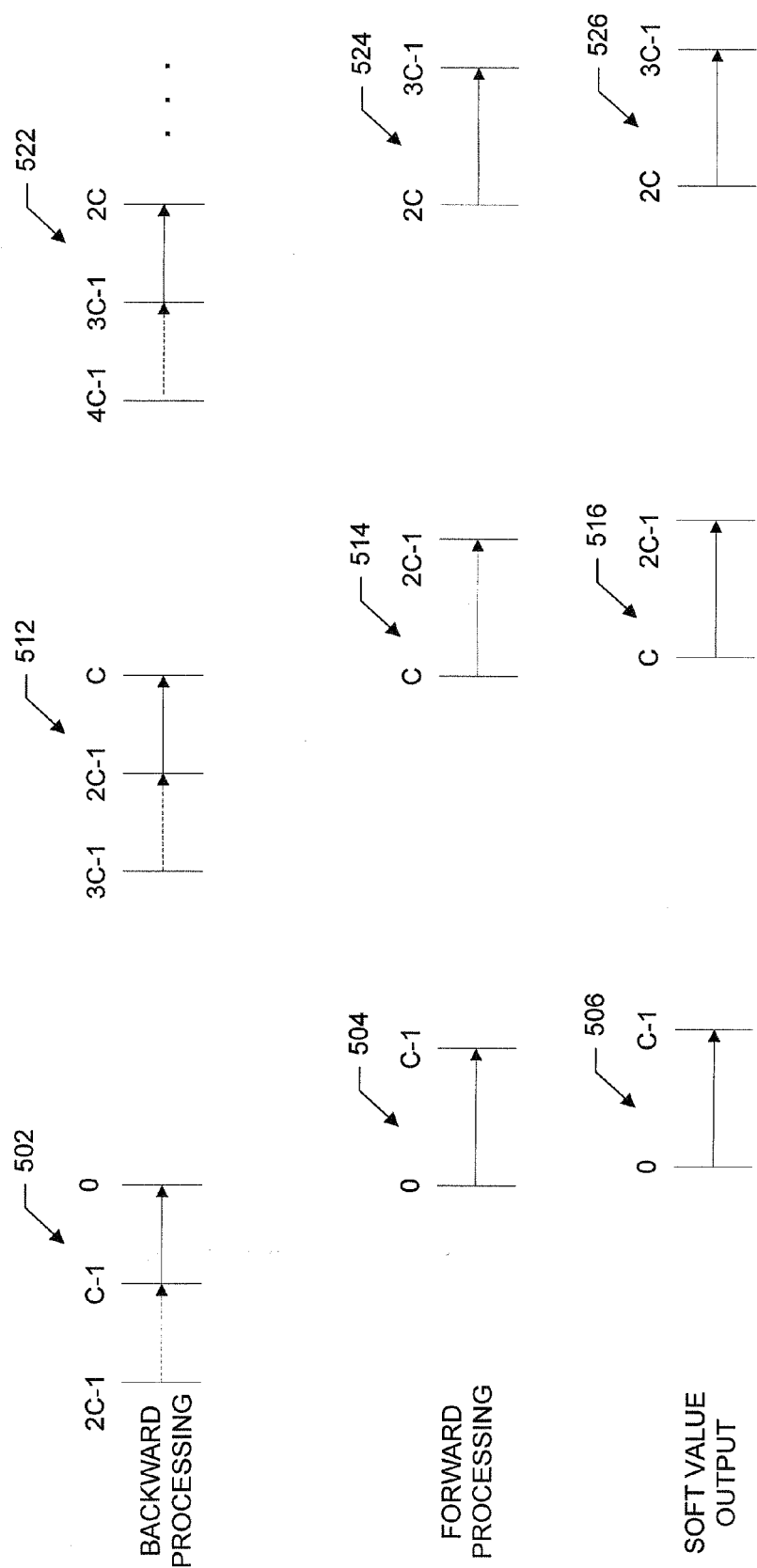
FIG. 5 depicts a time line for the processing operations.

Referring now also to FIG. 5, with a convergence length of C, the first backward processing convergence phase is performed for locations 2C−1 to C, as denoted by the dotted line segment of time line 502. The convergence phase starts from all zero state metrics at time 2C, and the state metrics produced in the convergence phase are unreliable, and thus, are not retained. The associated output phase produces reliable results for locations C−1 to 0, and the values are retained in the $\beta$-memory 122.

The MAP detector next performs the first forward, or $\alpha_1$ processing operation as denoted by time line 504. The forward processing utilizes predetermined forward state metrics for time 0 that include a favorable state metric for the known starting state. Accordingly, a convergence phase is not required, and the forward processing produces reliable forward state metrics for locations 0 to C−1. The reliable forward state metrics are further manipulated by the soft value processor 13 in a known manner, along with the retained backward state metrics for the corresponding locations, to produce the soft values for locations 0 to C−1 as denoted by time line 506.

At the first processing step in the forward processing operation, the stored forward state metrics for time 0 are provided from the $\alpha$-memory 124 to the ACS processors 120₀ ... 120_{j-1}, which perform add-compare-select operations and provide the state metrics of time 1 for bit location 0. The forward state metrics for location 0 are combined in a known manner with the backward state metrics for location 0 from the $\beta$-memory 122 in the soft processor 13. The soft value is then provided to the decoder 14.

As a next step in the forward processing operation, the state metric engine 120 performs add-compare-select operations to produce the forward state metrics for the next location. The state metric engine 120 provides the calculated forward state metrics to the $\alpha$-memory 124, to overwrite the previously stored values. The state metric values are at the same time provided to the soft value processor 13 for soft value computation. The forward processing continues in this manner until soft values are produced for locations 1 to C−1. The forward state metrics produced for the last location of the forward processing operation, that is, location C−1 at time C, are retained in the $\alpha$-memory 124 to be used in the first step of the next forward processor operation.

The state metric engine 120 performs a next backward processing operation $\beta_2$ involving locations 3C−1 to C, as denoted by time line 512. The convergence phase of the backward processing operation produces unreliable values for locations 3C−1 to 2C. The output phase starts at location 2C−1, and the calculated backward state metrics values for locations 2C−1 to C are stored in the α-memory 122 by overwriting the previously stored values.

The MAP detector then begins a next forward processing operation. The forward state metrics for location C−1, which were stored in the α-memory 124 at the end of the previous forward processing operation are utilized in the state metric engine 120, and reliable results are produced for locations C to 2C−1, as denoted by time line 514. The soft value processor 13 operating in a known manner determines soft values for the locations C to 2C−1 using the corresponding forward and backward state metrics provided from the respective memories as denoted by time line 516. The forward state metrics calculated for location 2C−1 are retained in the α-memory 124 for the next forward processing operation.

The forward and backward processing operations continue in this manner over next sections of the data block, using the same four ACS processors 120$_0$, 120$_1$, 120$_2$ and 120$_3$ for both the forward and the backward processing, until the soft values are determined for the entire block.

In one example of a MAP detector, the state metric engine 120$_0$ performs the following calculations to determine the backward state metric $S_0$ involving time t:

$$S_{0,t} = \min[S_{0,t+1} + B_{00} + apriori_{00}, S_{2,t+1} + B_{02} + apriori_{02}]$$

where $B_{00}$ is the branch metric for the branch from $S_{0,t+1}$ to $S_{0,t}$ and $apriori_{00}$ is the apriori value associated with the branch. As shown in FIG. 2, the apriori value is related to input bit '0,' and the selected apriori value is designated APRIORI 0 in FIG. 4. The apriori value associated with the branch from $S_{2,t+1}$ to $S_{0,t}$, that is, $apriori_{02}$, is related to an input bit '2' and the selected apriori value is designated APRIORI 1 in FIG. 4. The same state metric engine 120$_0$ performs the following calculations to determine the forward state metric $S_0$ involving time t:

$$S_{0,t+1} = \min[S_{0,t} + B_{00} + apriori_{00}, S_{1,t} + B_{10} + apriori_{10}].$$

Thus, generally speaking, the state metric engine 120$_0$ requires different state metrics, branch metrics and apriori values for the forward and backward processing calculations involving bit location t. Similarly, as illustrated by the trellis of FIG. 2, different state metrics, branch metrics and apriori values are used for the forward and backward processing involving states $S_1$, $S_2$ and $S_3$ with respect to the transition from time t to t+1.

In order to use the same four ACS processors 120$_0$ ... 120$_3$ for both forward and backward processing operations, the β-memory 122 stores the backward state metrics for, for example, locations C−1 to 0, in the order of $S_0$, $S_2$, $S_1$ and $S_3$ as shown in FIG. 3A. Further, the α-memory 124 stores the forward state metrics in the order of $S_0$, $S_1$, $S_2$ and $S_3$ as shown in FIG. 3B. The different orders facilitate the state metric engine's fetching of the correct prior state metrics and storing back the resultant state metrics to the appropriate memory cells in both forward and backward processing, without complicated wiring or multiplexers.

As illustrated in the drawings, the ACS processor 120$_0$ operating in the backward direction uses the backward state metrics for states $S_{0,t+1}$ and $S_{2,t+1}$, to produce the backward state metric for $S_{0,t}$. The ACS processor 120$_1$ operating in a backward direction produces the backward state metric for $S_{2,t}$ using the backward state metrics for states $S_{1,t+1}$ and $S_{3,t+1}$, while the ACS processor 120$_2$ operating in the backward direction produces the backward state metric for $S_{1,t}$ using the backward state metrics for states $S_{0,t+1}$ and $S_{2,t+1}$.

Further, the ACS processor 120$_3$ operating in the backward direction produces the backward state metric for $S_{3,t}$ using the metrics for states $S_{1,t+1}$ and $S_{3,t+1}$. Accordingly, the β-memory 122 stores the backward state metrics in the order $S_0$, $S_2$, $S_1$ and $S_3$, such that the processors 120$_0$ and 120$_2$ use the values from the top two memory cells, that is, cells 0 and 1, and produce values that are stored in cells 0 and 2 and the processors 120$_1$ and 120$_3$ use the values from the bottom two memory cells, that is, cells 2 and 3 and produce values that are stored in cells 1 and 3.

For forward processing, the ACS processors 120$_0$ and 120$_2$ similarly use values from the top two memory cells, though they are values from the α-memory 124, and produce values that are stored in cells 0 and 2, and the processors 120$_1$ and 120$_3$ use the values from the bottom two memory cells of the α-memory 124 and produce values that are stored in cells 1 and 3. The values in the memory cells of the α-memory are arranged in an order that corresponds to the forward processing. In the example, the processors 120$_0$ and 120$_2$ use the forward state metrics $S_{0,t}$ and $S_{1,t}$ to produce the forward state metrics for $S_{0,t+1}$ and $S_{2,t+1}$, respectively, and the processors 120$_1$ and 120$_3$ use the forward state metrics $S_{2,t}$ and $S_{3,t}$ produce the forward state metrics for $S_{1,t+1}$ and $S_{3,t+1}$. Accordingly, the α-memory stores the forward state metrics in the order $S_0$, $S_1$, $S_2$ and $S_3$.

The state metric engine 120 is wired such that the respective processors use the values from corresponding memory cells of the memories 122 and 124 and supply values to corresponding cells of the memories for the respective backward and forward processing operations. This is illustrated by the dotted lines in FIGS. 3A and 3B, which indicate where the results are stored. The dotted lines thus represent return paths for the calculated state metrics. A controller (not shown) directs a fetch operation and a write operation to the appropriate α or β memory for the respective forward or backward processing operations. Alternatively, the respective forward and backward operations could use different addressing circuitry for the two memories. However, the circuitry would be more complex.

Figure 4:
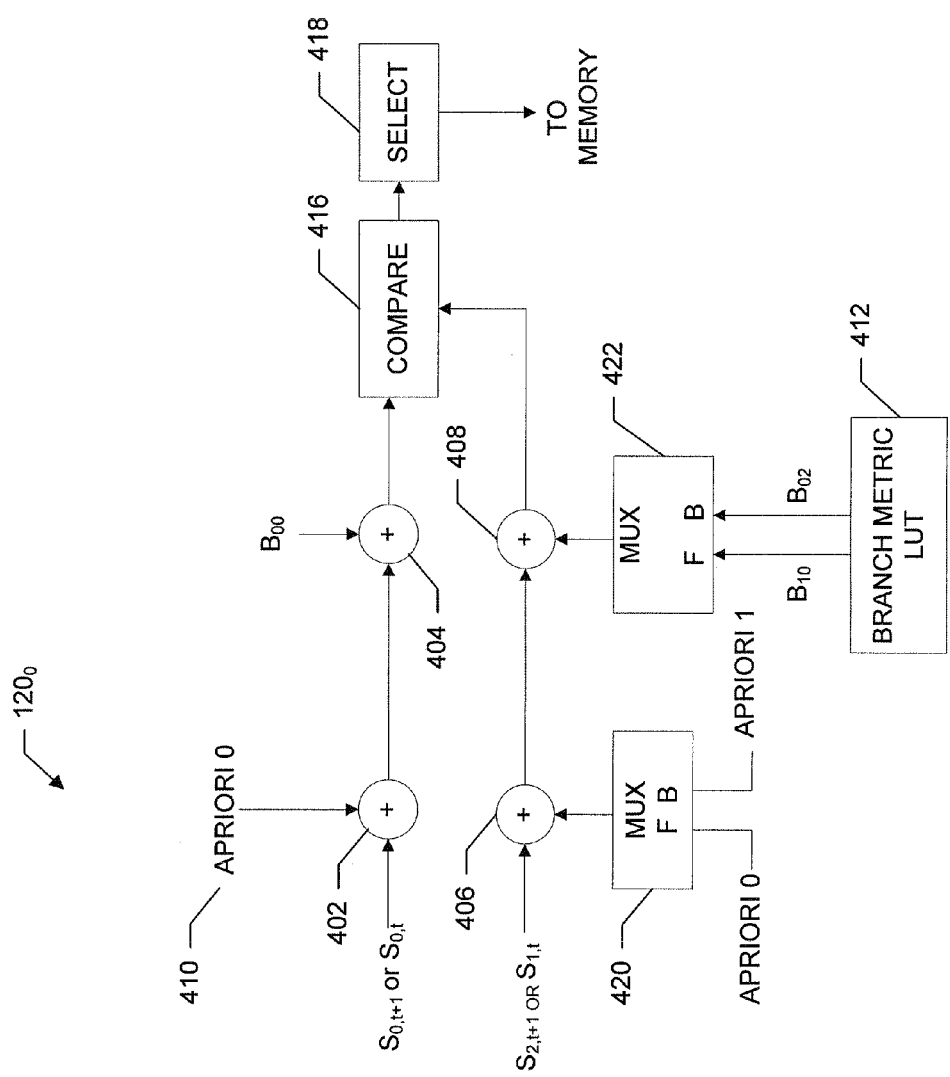
FIG. 4 depicts the state metric engines of FIG. 1 in more detail.

Referring now to FIG. 4, the ACS processor 120$_0$ is shown in more detail. As illustrated, the processor 120$_0$ calculates the backward and forward state metrics for state $S_0$. For the output phase of the backward processing operation, a controller directs a fetch operation to the β-memory 122 and the values from the top two cells of the appropriate memory location are supplied to the processor 120$_0$. An adder string 402 and 404 produces a first total that is based on the state metric value that is fetched from the top cell of the memory 122. The adder 402 adds to the fetched value the appropriate apriori value, for either a 0 trellis branch or a 1 trellis branch. While generally the apriori value may be selected through a multiplexer (not shown) from an apriori value buffer (not shown), the trellis of FIG. 2 dictates that the same apriori value is used in this adder string in both forward and backward processing. Accordingly, as shown in the drawing, the apriori value APRIORI 0 is provided directly to the adder. The sum from adder 402 is provided to adder 404, which adds the sum to the branch metric that is appropriate for the backward processing, namely, branch metric $B_{00}$. While generally the branch metric may be provided through a multiplexer (not shown) from a branch metric look-up table 412, the trellis of FIG. 2 dictates that the same branch metric is used in this adder string in both forward and backward processing. Accordingly, as shown in the drawing, the branch metric value $B_{00}$ is provided directly to the adder.

A second string of adders 406 and 408 produces a second total that corresponds to the backward state metric value read from the second cell of the memory 122. The adder 406 adds the apriori value for bit '1', supplied through a multiplexer 420 from the apriori buffer (not shown) to the backward state metric and the sum is provided to the adder 408. It should be also noted that apriori values for bits 0 and 1 are related, hence one can be computed from the other and only one value need to be stored in the apriori value buffer.

The adder 408 adds the result to the branch metric $B_{02}$ which is retrieved from the branch metric lookup table 412 and provided through a multiplexer 422. The multiplexer 422, under the control of the controller, selects the branch metric that is used for either the forward or backward processing operation. In the example, the multiplexer selects backward branch metric $B_{02}$, which is supplied to the "B" input line of the multiplexer. The branch metric table may instead be a branch metric computation engine (not shown) that operates under the control of the controller to generate the branch metrics on-the-fly and provides them to the multiplexer.

To provide the branch metrics to the multiplexer 422 from the branch metric lookup table 412, the controller selectively enters the branch metric lookup table using the signal sample for location t. The branch metric look-up table or computation engine provides the appropriate forward and backward branch metrics to the forward and backward input lines of the multiplexer 422. Alternatively, the multiplexer may select between two branch metric tables (not shown), one for forward processing and one for backward processing.

The totals produced by the two adder strings are compared in a compare circuit 416, which in the embodiment is an adder, and the best value is selected as the backward state metric by a selection multiplexer 418. In the example, the smaller value is selected.

During the output phase, the selected value is provided through to the β-memory 122 as the backward state metric for state $S_0$ at location t, and the value is stored in the top cell, that is, cell 0, of the appropriate memory location. The ACS processors $120_1$, $120_2$ and $120_3$ similarly produce the remaining backward state metrics for location t, and the values are stored in the appropriate memory cells of the β-memory.

When the system switches to forward processing, the processing starts from the last location involved in the previous forward processing step. Thus, the forward processing starts with the stored forward state metrics from the α-memory 124 and the operation does not require a convergence phase. The ACS processor $120_0$ utilizes the stored forward state metric values for $S_{0,t}$ and $S_{1,t}$ from the top two cells of the α-memory 124 in the respective adder strings along with the apriori values and branch metrics selected through the multiplexers 420 and 422. The processor $120_0$ produces an updated forward state metric for state $S_0$ at time t+1, and the value is stored in the top cell of the α-memory. At the same time, the ACS processors $120_1$, $120_2$ and $120_3$ each produce updated forward state metrics for time t+1, and the metrics are stored in the appropriate cells of the α-memory.

It is noted that the number of multiplexers depicted in FIG. 4 may be increased as appropriate to provide the apriori values and branch metrics to the adders in the respective processors $120_0 \ldots 120_{j-1}$ based on the particular decoding trellis or application. As discussed above, for the trellis shown in FIG. 2, one adder chain of the processor $120_0$ works with the same apriori values and branch metrics in both forward and backward processing, and thus, the chain does not require the associated multiplexers. With another decoding trellis different apriori values and branch metrics may be required for each adder chain in forward and backward processing and, thus, each adder chain may require two multiplexers.

The MAP detector may also be implemented such that the ACS processors in the state metric engine perform calculations in which apriori values are used only for branches that correspond to input bits '2', in which case the multiplexers associated with the apriori adders, e.g., multiplexer 420 in FIG. 4, select between the apriori values and a null or zero value.

In an alternative operation of the system, the backward state metrics that are produced for the last location in the backward processing are used directly by the soft value processor 13 along with the forward state metrics from the α-memory 124, to determine the soft value for that location. The β-memory 122 is thus C−1 locations wide.

The use of the α-memory 124 and the single state metric engine 120 results in less computation power, or a greater efficiency, for the coupled backward/forward processing operations than is achieved with a MAP detector that requires a convergence phase for both forward and backward processing. The α-memory eliminates the convergence phase of the forward processing, and thus, allows the soft values to be determined with a throughput of one-third of the clock rate. The efficiency of the backward processors is ½ since C computations are discarded and 2C computations are performed to produce C reliable results.

The system may be further optimized for either memory size or efficiency, as appropriate. If optimized for memory size, the backward processing may store state metrics in the output phase for only a portion of the convergence length. For example, the backward processing may be performed over C+½C locations, with reliable values determined for the locations ½C−1 to 0. The β-memory 122 is thus only ½C locations wide. However, each coupled backward and forward processing operation determines the soft values for a total of ½C locations, and thus, the backward processing operations have longer convergence phases than output phases.

If a larger β-memory 122 is used, the efficiency of the system can be increased since only C computations are discarded in the backward processing convergence phase and multiples of more than C reliable values are produced in the output phase. For example, a 2C sized β-memory results in a power efficiency of ⅔ for the backward processing. Using a smaller β-memory, for example, the ½C memory discussed above, the power efficiency is ⅓ since C+½C operations are performed to produce ½C reliable computations.

The savings in circuitry by using a single state metric engine is substantial. The savings, for example, in a MAP detector that uses n-bit branch metrics, n-bit apriori values and m-bit state metrics (m>n), and two state metric engines— one that consists of a set of j forward ACS processors and another that consists of a set j of backward ACS processors— are j m-bit selection multiplexers, j×5 m-bit adders, that is, two adders per incoming branch per state, and j m-bit adders that function as comparators. The trade-off is that the single state metric engine requires additional n-bit multiplexers for all or certain of the j processors, to provide the appropriate branch metric and apriori values. However, the n-bit multiplexers are significantly less complex and smaller than the state metric engine that is omitted, so the overall savings in the cost and complexity of the MAP detector and reduction in the size of the MAP detector are significant. Further, the savings are directly proportional to the number of states in the trellis, since the omission of a state metric engine eliminates a set of j ACS processors, that is, one ACS processor per state.

The foregoing description has been limited to a specific embodiment of this invention. It will be apparent, however, that variations and modifications may be made to the invention, with the attainment of some or all of its advantages. For example, the MAP decoder may be used to decode convolutionally encoded bits with an associated convolutional code trellis, in which more than two branches may lead into the respective states and the state metric engine includes corresponding numbers of adder strings that are grouped appropriately into the associated ACS processors. Therefore, it is the object of the appended claims to cover all such variations and modifications as come within the true spirit and scope of the invention.

What is claimed is:

1. A maximum a posteriori (MAP) detector for decoding a data block, the MAP detector including:
   A. a state metric engine that performs both forward and backward processing operations to produce state metrics that correspond to states in an associated decoding trellis, the state metric engine performing the backward processing operation with a convergence phase in which the backward state metric values are not reliable and an output phase in which the backward state metric values are reliable;
   B. memory that stores the state metrics in a forward processing order and a backward processing order, the memory storing the backward state metrics calculated during the output phase; and
   C. a soft value processor that manipulates the forward and the backward state metrics to produce corresponding soft values.

2. The MAP detector of claim 1 wherein the state metric engine includes a plurality of add-compare-select processors.

3. The MAP detector of claim 2 wherein the processors include multiplexers that selectively provide the branch metric and apriori values for the forward and the backward processing operations.

4. The MAP detector of claim 3 wherein the processors perform a backward processing operation first to product corresponding reliable backward state metric values and forward processing operation second to produce reliable forward state metrics for the corresponding data locations.

5. The MAP detector of claim 1 wherein
   the memory retains the forward state metrics calculated for the last location of the forward processing operation for use in a next forward processing operation,
   the state metric engine utilizes the stored forward state metric values in the first step of the next forward processing operation, and
   the soft value processor utilizes the calculated forward state metrics to produce the corresponding soft value.

6. A method of determining soft values for bits of a data block in accordance with a decoding trellis, the method including the steps of:
   A. processing input values for states of the trellis in a state metric engine in a first processing direction and in a second processing direction, wherein the first processing direction is backward and the backward state metrics for every location in an output phase of the backward processing operation are retained in a first order; and
   B. producing the soft values for bits corresponding to the respective locations by manipulating the state metrics.

7. The method of claim 6 wherein the second processing direction is forward and the state metrics for each location are retained in a second order and overwritten by the next state metrics produced in the forward direction.

8. The method of claim 7 wherein forward state metrics for time t and corresponding branch metrics and apriori values for bit location t are provided to the state metric engine to produce the forward state metrics for time t+1.

9. The method of claim 6 wherein the backward state metrics for the time t+1 and corresponding branch metrics and apriori values for bit location t are provided to the state metric engine to produce the backward state metrics for time t.

10. A state metric engine including:
    a set of adder strings;
    one or more multiplexers for selectively providing values to the set of adder strings, the multiplexers providing backward values for backward processing operations and forward values for forward processing operations;
    compare and select circuits for comparing the results produced by respective adder strings and selecting backward state metrics and forward state metrics; and
    memory for storing the backward state metrics and the forward state metrics, wherein the memory stores the backward state metrics in a first order that corresponds to the backward processing operations and the forward state metrics in a second order that corresponds to the forward processing operations.

11. The state metric engine of claim 10 wherein the multiplexer provides apriori values and branch metrics for respective adder strings.

12. The state metric engine of claim 11 wherein the adder strings are grouped dependent upon number of branches entering a state, with each adder string including an apriori adder and a branch metric adder.

13. The state metric engine of claim 12 wherein one or more multiplexers for selecting apriori values and branch metrics are associate with each processor.

14. The state metric engine of claim 13 wherein the processors are associated with respective compare circuits that compare the results produced by the first and second adder strings in a given processing operation.

15. The state metric engine of claim 14 wherein the backward processing operation has a an output phase of length C or greater to optimize efficiency or less to optimize memory size thereof, where C is a channel convergence length, and the memory retains for a given backward processing operation the backward state metrics produced during the output phase.

16. The state metric engine of claim 15 wherein the backward state metrics produced during the output phase of a next backward processing operation overwrite the backward state metrics retained in the memory.

17. The state metric engine of claim 16 wherein the memory retains the forward state metrics for a last location for use in a next forward processing operation, and the forward processing operation is an output phase.

18. A maximum a posteriori (MAP) detector for decoding a data block, the MAP detector including:
    A. a state metric engine that performs both forward and backward processing operations to produce state metrics that correspond to states in an associated decoding trellis;
    B. memory that stores the state metrics in a forward processing order and a backward processing order, the memory retaining the forward state metrics calculated for a last location of the forward processing operation for use in a next forward processing operation, the state metric engine utilizing the stored forward state metric values in a first step of the next forward processing operation; and
    C. a soft value processor that manipulates the forward and the backward state metrics to produce corresponding soft values, the soft value processor utilizing the calculated forward state metrics to produce a corresponding soft value.

* * * * *